(12) United States Patent
Oshige et al.

(10) Patent No.: US 9,978,804 B2
(45) Date of Patent: May 22, 2018

(54) ELECTRONIC DEVICE, METHOD OF MANUFACTURING THE SAME, AND CAMERA

(71) Applicant: CANON KABUSHIKI KAISHA, Tokyo (JP)

(72) Inventors: Hidemasa Oshige, Yokohama (JP); Nobutaka Ukigaya, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/468,417

(22) Filed: Mar. 24, 2017

(65) Prior Publication Data

US 2017/0287973 A1 Oct. 5, 2017

(30) Foreign Application Priority Data

Apr. 1, 2016 (JP) .................................. 2016-074601

(51) Int. Cl.
*H01L 31/0232* (2014.01)
*H01L 27/146* (2006.01)
(Continued)

(52) U.S. Cl.
CPC .. *H01L 27/14683* (2013.01); *H01L 21/76898* (2013.01); *H01L 24/32* (2013.01); *H01L 27/14618* (2013.01); *H01L 27/14627* (2013.01); *H01L 27/14636* (2013.01); *H01L 2224/3201* (2013.01); *H01L 2224/32053* (2013.01); *H01L 2224/32058* (2013.01); *H01L 2224/32225* (2013.01)

(58) Field of Classification Search
CPC ......... H01L 27/14683; H01L 27/14618; H01L 27/14627; H01L 27/14636; H01L 24/32; H01L 21/76898; H01L 2224/3201; H01L 2224/32053; H01L 2224/32058; H01L 2224/32225
See application file for complete search history.

(56) References Cited

U.S. PATENT DOCUMENTS 7,425,499 B2 * 9/2008 Oliver ............... H01L 21/76898
257/E21.597
8,422,136 B2   4/2013 Hasegawa
(Continued)

FOREIGN PATENT DOCUMENTS

JP    2004-342992 A    12/2004
JP    2006-049700 A    2/2006
(Continued)

*Primary Examiner* — Mark Tornow
(74) *Attorney, Agent, or Firm* — Fitzpatrick, Cella, Harper & Scinto

(57) ABSTRACT

A method of manufacturing an electronic device, comprising fixing a first wafer on a second wafer to form a space theirbetween, via a surrounding member configured to surround the space, forming an opening on a bottom side of the first wafer to expose a conductive member included in the first wafer, and then forming an electrode connected to the conductive member, wherein, in the fixing, the first wafer includes a trench intersecting the surrounding member, on an upper side of the first surface, and, in the forming, the electrode is formed under a condition that the space communicates with an external space via the trench.

14 Claims, 8 Drawing Sheets

(51) Int. Cl.
*H01L 21/768* (2006.01)
*H01L 23/00* (2006.01)

(56) References Cited

U.S. PATENT DOCUMENTS

| | | | | |
|---|---|---|---|---|
| 8,541,820 B2* | 9/2013 | Hayasaki | .......... | H01L 21/76898 257/184 |
| 8,680,636 B2 | 3/2014 | Yajima et al. | | |
| 2010/0006963 A1* | 1/2010 | Brady | .............. | H01L 27/14618 257/432 |
| 2013/0168792 A1* | 7/2013 | Haddad | ............. | H01L 31/02363 257/432 |
| 2016/0218136 A1* | 7/2016 | Lee | ................... | H01L 27/14636 |

FOREIGN PATENT DOCUMENTS

| JP | 2007-128987 A | 5/2007 |
|---|---|---|
| JP | 2007-178133 A | 7/2007 |
| JP | 2008-251712 A | 10/2008 |
| JP | 2009-147092 A | 7/2009 |
| JP | 2009-147093 A | 7/2009 |
| JP | 2010-286407 A | 12/2010 |
| JP | 2012-069851 A | 4/2012 |

* cited by examiner

F I G. 2A
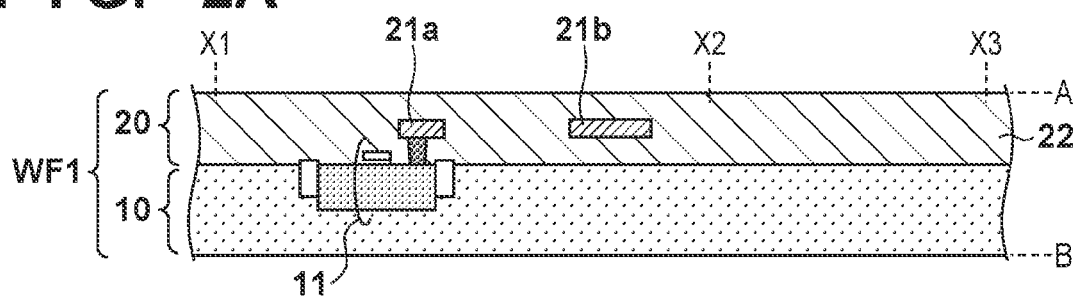
F I G. 2B
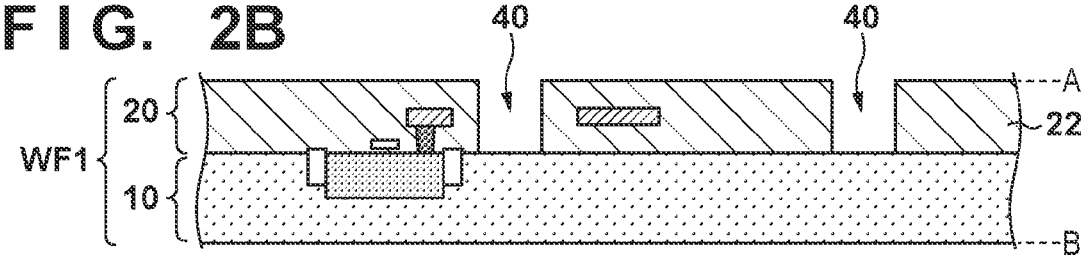
F I G. 2C
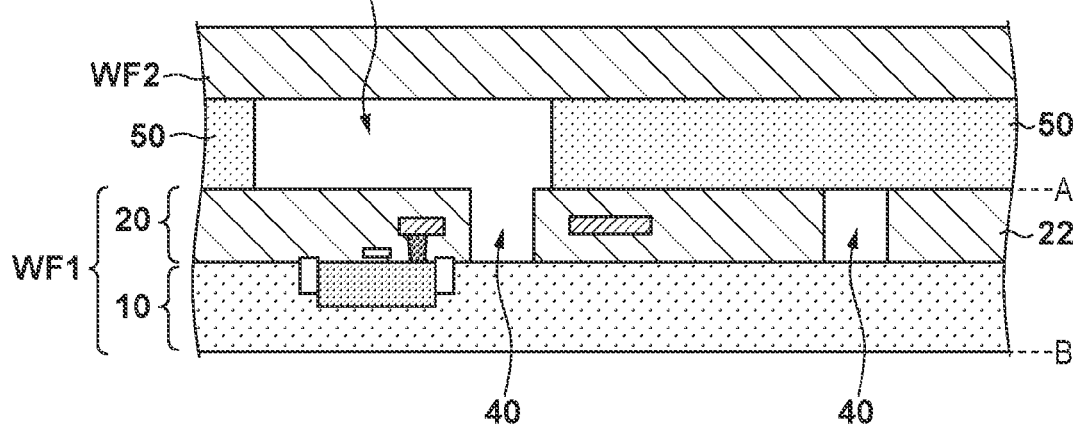
F I G. 2D
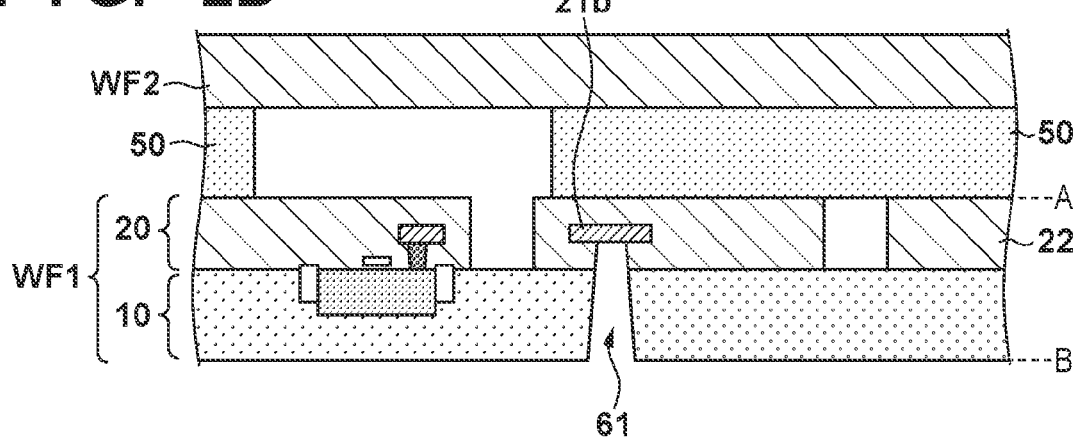

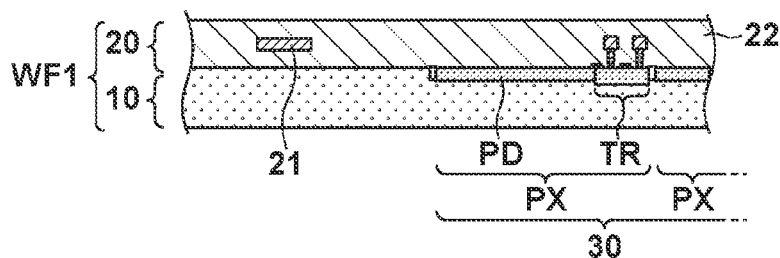
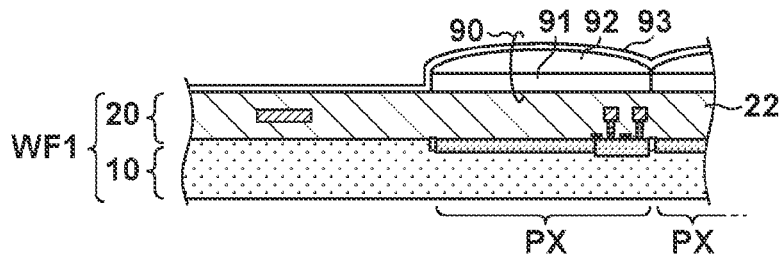
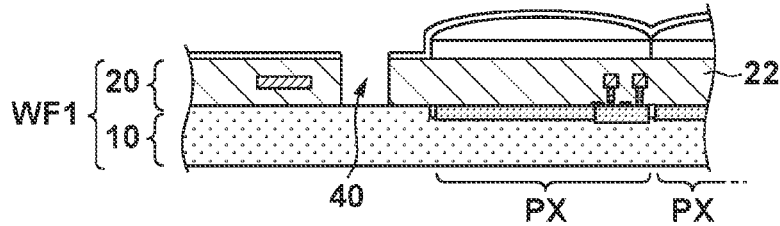
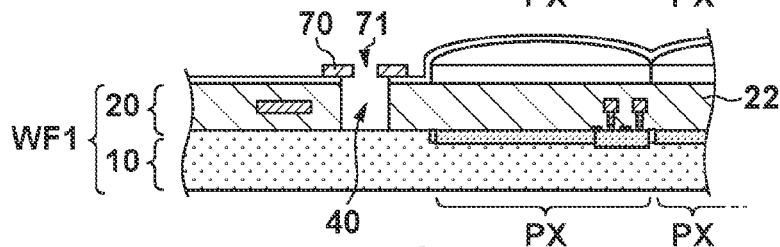
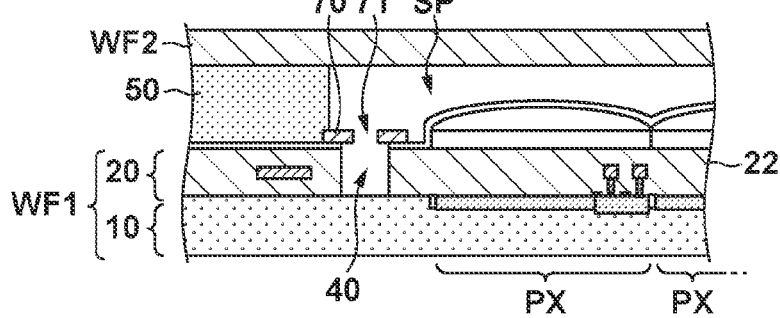
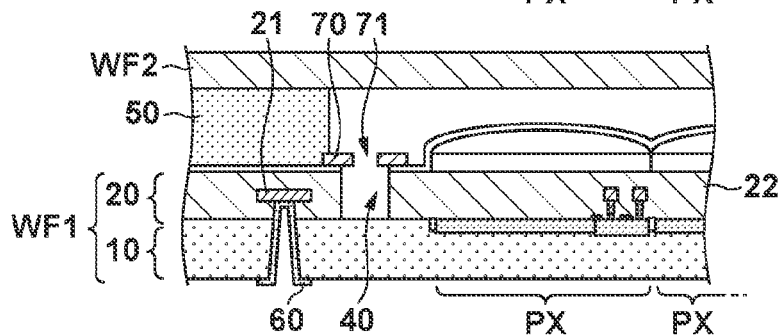

ELECTRONIC DEVICE, METHOD OF MANUFACTURING THE SAME, AND CAMERA

BACKGROUND OF THE INVENTION

Field of the Invention

The present invention relates to an electronic device, a method of manufacturing the same, and a camera.

Description of the Related Art

As an example of electronic device packaging techniques, WLCSP (Wafer Level Chip Size Package) is known. A method of manufacturing a solid-state imaging device based on WLCSP is described in Japanese Patent Laid-Open No. 2006-49700. More specifically, after adhesion of a wafer (11) and a glass substrate (12) before dicing, electrodes such as a through-hole wiring (24) and an external connection terminal (26) are formed on the surface of the wafer on the opposite side of the glass substrate. To form the electrodes, for example, a semiconductor manufacturing process, for example, an etching process such as dry etching or a deposition process such as sputtering can be used.

According to Japanese Patent Laid-Open No. 2006-49700, a gap portion (a space or a gap) separated from an external space by a spacer (13) that joins the wafer and the glass substrate exists between the wafer and the glass substrate. For this reason, in the semiconductor manufacturing process when forming the above-described electrodes, a pressure difference can be generated between the gap portion and the external space. This pressure difference may generate stress on the wafer or glass substrate, damage them, or peel them. Hence, this can lower the reliability of the electronic device.

SUMMARY OF THE INVENTION

The present invention provides a technique advantageous in improving the reliability of an electronic device.

One of the aspects of the present invention provides a method of manufacturing an electronic device, comprising fixing a first wafer and a second wafer to each other via a surrounding member, such that the first wafer and the second wafer face each other via a space and the surrounding member surrounds the space, the first wafer including a semiconductor substrate and a wiring structure arranged on the semiconductor substrate, and forming an opening on a side of a second surface of the first wafer on an opposite side of a first surface on a side of the second wafer so as to expose a conductive member of the wiring structure, and then forming an electrode connected to the conductive member exposed via the opening, wherein in the fixing, the first wafer includes, on a side of the first surface, a trench that intersects the surrounding member in a planar view of the first surface, and in the forming, the electrode is formed under a condition that the space communicates with an external space via the trench.

Further features of the present invention will become apparent from the following description of exemplary embodiments with reference to the attached drawings.

BRIEF DESCRIPTION OF THE DRAWINGS

FIGS. 2A to 2D are views for explaining an example of the method of manufacturing the electronic device;

FIGS. 7A to 7F are views for explaining a state in one step of a method of manufacturing an imaging device.

DESCRIPTION OF THE EMBODIMENTS

Figure 1A:
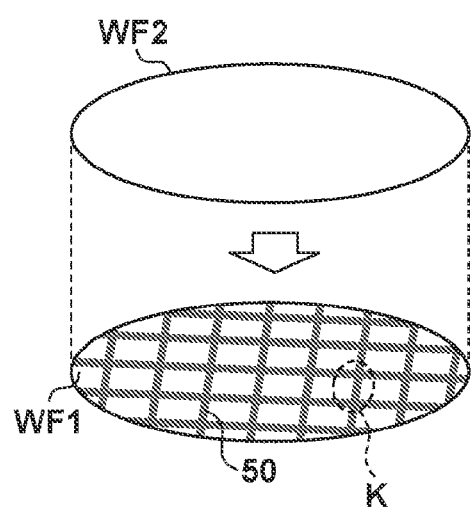
FIGS. 1A to 1C are views for explaining a state in one step of a method of manufacturing an electronic device.

Preferred embodiments of the present invention will now be described with reference to the accompanying drawings. Note that the drawings are shown for the purpose of explaining a structure or an arrangement, and the sizes of illustrated members do not always reflect actual sizes. In addition, the same reference numerals denote the same members or constituent elements throughout the drawings, and a repetitive description will be omitted.

First Embodiment

A method of manufacturing an electronic device according to the first embodiment will be described with reference to FIGS. 1A, 1B, 1C, 2A, 2B, 2C, and 2D. FIG. 1A shows one step in the method of manufacturing an electronic device in WLCSP (Wafer Level Chip Size Package). More specifically, FIG. 1A shows a step of adhering a second wafer WF2 to a first wafer WF1 as indicated by the arrow in FIG. 1A. A grid-shaped surrounding member 50 is formed on the upper surface (the surface on the adhering side) of the first wafer WF1. The wafers WF1 and WF2 are fixed to each other via the surrounding member 50. Note that when adhering the first wafer WF1 and the second wafer WF2, the surrounding member 50 may be formed on the side of the second wafer WF2. The wafers WF1 and WF2 fixed to each other undergo a process of forming an external electrode (to be described later) and then dicing, whereby one or more electronic devices are obtained. In the electronic device, the first wafer WF1 after the dicing forms a chip (first member), and the second wafer WF2 after the dicing forms a cover (second member).

Figure 1B:
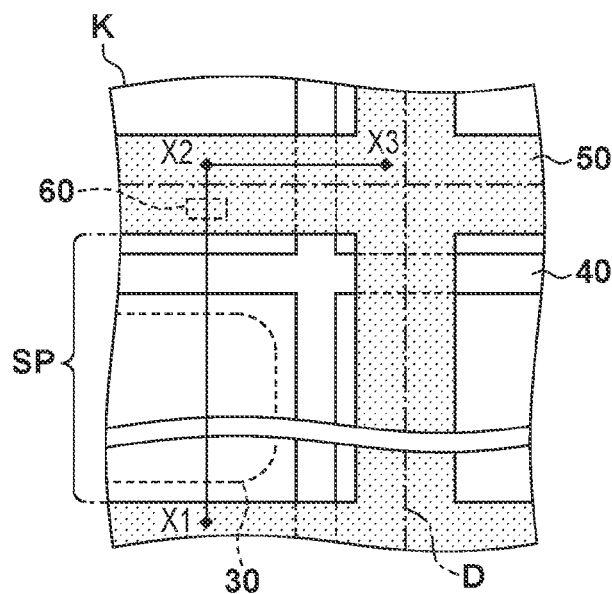
Figure 1C:
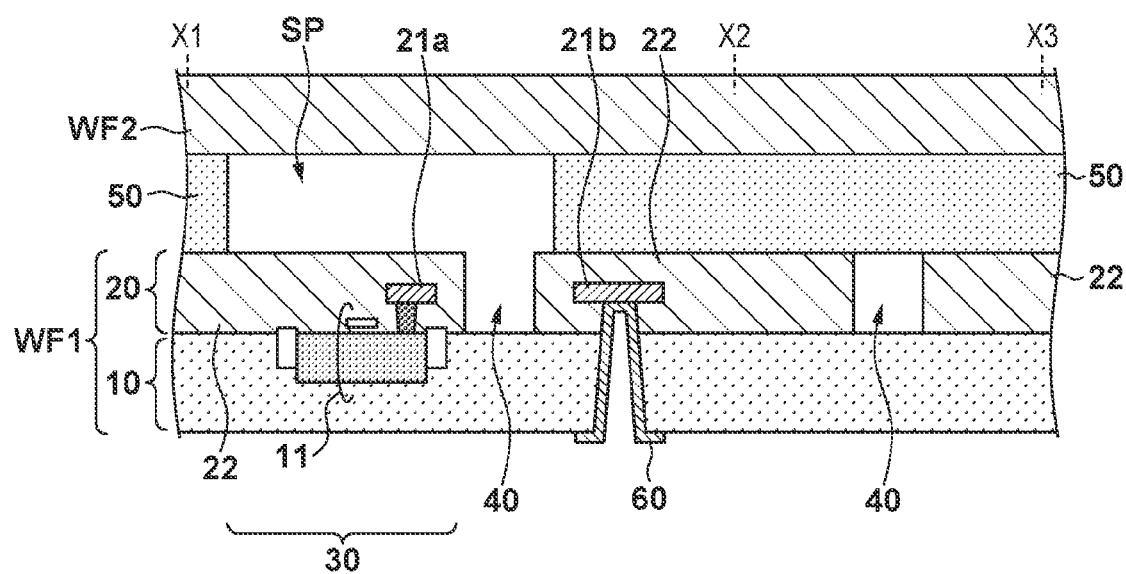

FIG. 1B is an enlarged view of a planar view (a planar view of the upper surface of the first wafer WF1, and ditto) of a region K shown in FIG. 1A. Alternate long and short dashed lines D in FIG. 1B indicate scribe lines. FIG. 1C is a schematic view of the sectional structure taken along a cut line X1-X2-X3 in FIG. 1B. For easy understanding, a structure after the first wafer WF1 and the second wafer WF2 are adhered is illustrated here.

As shown in FIG. 1C, the first wafer WF1 includes, for example, a semiconductor substrate 10 and a wiring structure 20 arranged on it. A semiconductor element 11 is formed on the semiconductor substrate 10. As an example of the element 11, one MOS transistor is shown. However, a plurality of elements 11 are formed on the semiconductor substrate 10. The wiring structure 20 includes conductive members 21a and 21b (to be simply referred to as a "conductive member 21" hereinafter if no particular distinction is needed between them), and an insulating member 22 including the conductive members.

In this example, the wiring structure 20 including one wiring layer is shown. However, the number of wiring layers may be 2 or more. The conductive member 21 is a member included in the insulating member 22, and is a wiring or electrode configured to supply a voltage or signal to the element 11 or output a voltage or signal from the element 11. The conductive member 21 can include not only a wiring pattern (aluminum or the like) but also a contact plug that connects the wiring pattern to the upper surface of the semiconductor substrate 10, and if the number of wiring layers is 2 or more, a via plug or the like (tungsten or the like) that connects the wiring patterns between the layers. The conductive member 21 can include a copper wiring having a dual damascene structure. The conductive member 21a in FIG. 1C is illustrated as a wiring pattern in electrical contact with the element 11, and the conductive member 21b is illustrated as a wiring pattern in electrical contact with an external electrode 60, as will be described later in detail.

The second wafer WF2 is fixed on the surrounding member 50 on the first wafer WF1. The surrounding member 50 can be an adhesion member used to adhere the first wafer WF1 and the second wafer WF2 but may be a spacer that defines the interval between the first wafer WF1 and the second wafer WF2. As the second wafer WF2, a light-transmitting substrate, for example, as a glass substrate is used. As described above, the surrounding member 50 is grid-shaped. Hence, a space SP (the space may be expressed as a gap, void, hollow, or the like) defined by the surrounding member 50 exists between the first wafer WF1 and the second wafer WF2. Note that the surrounding member 50 may be grid-shaped but may have a pattern other than the grid-shaped pattern because it need only have a shape to surround the space SP.

A trench 40 is formed in the upper surface of the first wafer WF1 and connected to the space SP. At least the side surfaces of the trench 40 can be defined by the insulating member 22. The bottom surface of the trench 40 may be defined by the semiconductor substrate 10, as shown in FIG. 1C, but may be defined by the insulating member 22 (a part of the insulating member 22 may exist between the bottom surface and the semiconductor substrate 10).

As shown in FIG. 1B, the trench 40 is grid-shaped so as to substantially extend up to the edges of the first wafer WF1, thereby making the space SP communicate with the external space. The external space is the region around the wafers WF1 and WF2. Hence, the external space mainly has the atmospheric pressure. Alternatively, for example, if the wafers WF1 and WF2 are set in a chamber of a semiconductor processing apparatus, the external space has the pressure in the chamber. The trench 40 need only be formed to make the space SP communicate with the external space, and may extend in both directions along the surrounding member 50. However, the trench 40 may extend only in one direction. In another example, the extending direction of the trench 40 need not be parallel to the extending direction of the surrounding member 50. Note that in the planar view, a region surrounded by both the grid-shaped trench 40 and the grid-shaped surrounding member 50 is an element formation region 30. The above-described element 11 can be formed in the region 30.

On the lower surface side of the first wafer WF1, the external electrode 60 extending up to the conductive member 21b is formed. The electrode 60 is an electrode configured to electrically connect the electronic device to an external device such as a printed circuit board. The electrode 60 is formed to penetrate the semiconductor substrate 10, and therefore, is also called a through electrode. The electrode 60 can be obtained by, for example, forming an opening to expose the conductive member 21b on the lower surface side of the first wafer WF1 and then forming a metal member in the opening, as will be described later in detail. In the step of forming the electrode 60, for example, a pressure difference can be generated between the space SP and the external space by dry etching or the like performed in an almost vacuum state. However, since the spaces communicate via the trench 40, the pressure difference between them is reduced.

FIGS. 2A to 2D show the states of several steps in the method of manufacturing the electronic device. In the manufacturing method, a known semiconductor manufacturing process is used. Note that an annealing process or a cleaning process can be performed between the steps as needed, although a description thereof will be omitted below.

In the step shown in FIG. 2A, the first wafer WF1 is prepared. The first wafer WF1 includes the semiconductor substrate 10 with the element 11, and the wiring structure 20 formed on the semiconductor substrate 10 and including the conductive members 21 and the insulating member 22 including the conductive members 21. In this example, the wiring structure 20 is located on the upper surface (a surface A in FIG. 2A) side of the first wafer WF1, and the semiconductor substrate 10 is located on the lower surface (a surface B in FIG. 2A) side. In this step, a wafer with the wiring structure 20 formed on the semiconductor substrate 10 in advance may be prepared.

Although not illustrated, the insulating member 22 can be formed from a plurality of insulating layers, and the conductive members 21 can be formed between them. The plurality of insulating layers may use materials different from each other. For example, a BPSG (Boron Phosphorus Silicon Glass) film having a thickness of about 1.4 [μm] may be used as the first insulating layer, and a $SiO_2$ film having a thickness of about 1.6 [μm] may be used as the second insulating layer.

In the step shown in FIG. 2B, the trench 40 is formed in the surface A of the first wafer WF1. More specifically, the insulating member 22 is partially removed, thereby forming the trench 40. The trench 40 may be formed to expose the upper surface of the semiconductor substrate 10, as shown in FIG. 2B. However, the upper surface need not always be exposed (a part of the insulating member 22 may exist between the upper surface and the bottom surface of the trench 40). This step is executed by dry etching or the like. For example, the step is executed by parallel plate RIE (Reactive Ion Etching) under the condition of a reaction gas such as $C_4F_8$, $C_4F_6$, $CHF_3$, or $CF_4$.

In the step shown in FIG. 2C, the first wafer WF1 and the second wafer WF2 are adhered by the surrounding member 50. More specifically, the second wafer WF2 is fixed to the side of the surface A of the first wafer WF1 by the surrounding member 50. The wafers WF1 and WF2 face each other via the surrounding member 50 so as to form the space SP between them. The surrounding member 50 can be formed into a grid-shaped pattern and surrounds the space SP, as described above. As is apparent from FIG. 1B, in the planar view, the trench 40 intersects the surrounding member 50, overlaps the space SP, and extends toward the edges of the first wafer WF1 such that the space SP communicates with the external space.

To obtain the state in which the space SP communicates with the external space (to prevent the spaces from being separated), the trench 40 is prevented from being filled with the surrounding member 50 at the intersection between the trench 40 and the surrounding member 50. Hence, when adhering the first wafer WF1 and the second wafer WF2, if the surrounding member 50 is formed on the surface A of the first wafer WF1, a material having a desired viscosity is selected for the surrounding member 50. Alternatively, for example, the trench 40 may be formed such that its side surfaces have a liquid repellency higher than that of the upper surface of the insulating member 22. For example, if a reaction gas having a relatively high carbon content such as $C_4F_8$ or $C_4F_6$ is used in the step of forming the trench 40, a CF polymer-based by-product having a liquid repellency can be formed on the side surfaces of the trench 40. In this case, the conditions and order of subsequent steps (for example, an asking process and the like) and materials to be used there are appropriately selected to prevent the by-product from being removed by the subsequent steps.

To form the surrounding member 50, an application method such as screen printing is used. For the surrounding member 50, an UV curing resin or a thermosetting resin is used. When using a UV curing resin, UV irradiation is performed in a state in which the wafers WF1 and WF2 are adhered, thereby curing the resin. A heat treatment is also performed to further cure the resin. When using a thermosetting resin, a heat treatment is performed in a state in which the wafers WF1 and WF2 are adhered. Note that the surrounding member 50 can also be used as an adhering member. If the adhesion of the surrounding member 50 itself is low, an adhering member that adheres the surrounding member 50 to the wafer WF1 and/or the wafer WF2 is separately used.

Note that after that, the side of the surface B of the first wafer WF1 may be ground by back grinding to thin the first wafer WF1 to, for example, about 200 [μm].

In the step shown in FIG. 2D, an opening 61 is formed on the side of the surface B of the first wafer WF1. This step is performed by, for example, dry etching. For example, etching of the semiconductor substrate 10 can be done by, for example, inductive coupling RIE under the condition of a reaction gas such as $SF_6$ or $C_4F_8$. In addition, etching of the insulating member 22 of the wiring structure 20 can be done by, for example, parallel plate RIE under the condition of a reaction gas such as $C_4F_8$, $C_5F_8$, or $C_4F_6$.

This step is typically performed under the environment of an almost vacuum state and/or under a relatively high temperature condition. For this reason, if the space SP does not communicate with the external space (if the space SP is enclosed), the pressure difference that can be generated between the space SP and the external space becomes large. This may cause stress on the wafers WF1 and WF2, damage them, and peel them, resulting in a decrease in the reliability of the electronic device. In this example, however, since the space SP communicates with the external space via the trench 40, the pressure difference is reduced. Hence, according to this example, the reliability of the electronic device can advantageously be improved.

When, for example, setting the interior of the chamber of the semiconductor processing apparatus in an almost vacuum state to perform the above-described etching, the conductance of the gas in the trench 40 that connects the space SP and the external space (here, the interior of the chamber) needs to be taken into consideration, as will be described later in detail. For example, if the interior of the chamber is changed from the atmospheric pressure (about $10^5$ [Pa]) to the almost vacuum state ($10^{-3}$ [Pa] or less), the pressure in the chamber is changed by a change amount that does not generate a large pressure difference between the space SP and the interior of the chamber. For example, the gas in the chamber may be moderately discharged to lower the pressure from the atmospheric pressure to about $10^3$ [Pa] (slow discharge step), and then, the almost vacuum state may be set. Additionally, regarding the conductance in the trench 40, the width and depth of the trench 40 are determined so no large pressure difference is generated between the space SP and the interior of the chamber by the change of the pressure in the chamber.

After that, a conductive film that is made of a metal such as copper, aluminum, or tungsten and/or a metallic compound such as titanium nitride or tantalum nitride and extends from the side of the surface B up to the conductive member 21b is formed in the opening 61, thereby forming the electrode 60. The structure shown in FIG. 1C is thus obtained. This example shows a form in which a conductive film that covers the side surfaces and the bottom surface (the surface of the side of the conductive member 21b) of the opening 61 and the periphery of the opening 61 is formed. In addition, the opening 61 covered by the conductive film may be filled with the conductive material or another metal (solder or the like). This step can typically be performed by a deposition method such as sputtering. Hence, according to this example, the pressure difference that can be generated in this step can also be reduced, and the reliability of the electronic device can advantageously be improved.

Finally, dicing is performed for the wafers WF1 and WF2 fixed to each other along the alternate long and short dashed lines D shown in FIG. 1B, thereby obtaining one or more electronic devices. In each electronic device obtained in this way, a portion corresponding to the first wafer WF1, a portion corresponding to the second wafer WF2, and a portion that joins the two portions via the space SP have side surfaces that are flush with each other (the side surfaces match the planes of dicing). In a single electronic device in focus, the space SP still communicates with the external space on the planes of dicing. The space SP may remain communicating with the external space. However, if necessary, the space SP may be disconnected from the external space by filling the trench 40 with a resin or the like on the planes of dicing in a subsequent step.

As already described above, the conductance of the gas in the trench 40 that connects the space SP and the external space (here, the interior of the chamber) needs to be taken into consideration. More specifically, the width and depth of the trench 40 can be determined in consideration of the conductance of the gas in the trench 40 so no large pressure difference is generated between the space SP and the interior of the chamber by the change of the pressure of the external space. The conductance represents the easiness of flow of the gas. For example, the larger the sectional area (the product of the width and the depth) of the trench 40 is, the more easily the gas flows (the larger the conductance is).

For example, assume a conductance C between two points spaced apart by a distance L in a pipe having a radius $\underline{a}$. Letting p be the average pressure between the two points, p1 be the pressure at one of the two points, p2 be the pressure at the other point, and η be the viscosity coefficient of the gas, $$C=(\eta a^4 p/8\eta)/L \; [m^3/sec],$$

$$p=(p1+p2)/2 \; [Pa]$$

If the viscosity coefficient η is $18.1 \times 10^{-6}$ [Pa×sec], the conductance C is given by $$C=21700 \times a^4 p/L \; [m^3/sec]$$

In addition, the one pressure p1 is set to $10^5$ [Pa], and the other pressure is set to $10^3$ [Pa] (the target in the slow discharge step). At this time, using a sectional area S ($=\eta a^2$) of the pipe, the conductance C is given by $$C = 1.1 \times 10^8 \times S^2/L \ [m^3/sec]$$

In this example, let W be the width of the trench 40, H be the depth of the trench 40, and V be the volume of the space SP at the distance L from the edge of the first wafer WF1. At this time, a time T needed to lower the pressure in the space SP is expressed as $$T = V/C \ [\text{sec}]$$
$$= 9.1 \times 10^{-9} \times VL/S^2 \ [\text{sec}],$$
$$S = W \times H [m^2]$$

If the target value of the time T is set to 5,000 [sec] or less based on the manufacturing efficiency of the electronic device, the sectional area S of the trench 40 needs to satisfy $$S > 1.35 \times 10^{-6} \times (VL)^{1/2} \ [m^2]$$

For example, if the volume V of the space SP is $1.5 \times 10^{-9}$ [$m^3$], the distance L is 0.1 [m], and the depth of the trench 40 is 3 [μm], the width W of the trench 40 needs to satisfy $$W > 5.3 \ [\mu m]$$

If the width W of the trench 40 is too large, the trench 40 may be filled with the surrounding member 50 at the intersection between the trench 40 and the surrounding member 50, and the space SP may be disconnected from the external space. In the above example, the target value of the width W is calculated based on a simple model with one trench 40 in focus. Actually, since the simple space SP is connected to the external space via two or more routes, as illustrated, the width W is determined in consideration of this.

As described above, according to this example, the space SP between the wafers WF1 and WF2 fixed to each other by the surrounding member 50 communicates with the external space via the trench 40 in the upper surface (surface A) of the first wafer WF1. For this reason, in the semiconductor processing step including the step of forming the electrode 60, the pressure difference that can be generated between the space SP and the external space can be reduced. Hence, as described above, according to this example, the reliability of the electronic device can advantageously be improved.

Note that as another example, a method of forming, in the second wafer WF2, a through hole that makes the space SP communicate with the external space may be considered. However, the second wafer WF2 can have a sufficient strength to resist the condition of the step of forming the opening 61 or the like, and it is therefore difficult to form a through hole in the second wafer WF2. In addition, if a through hole is formed in the second wafer WF2, the strength of the second wafer WF2 may lower. However, according to this example, the space SP can be made to communicate with the external space without forming a through hole in the second wafer WF2.

Second Embodiment

Figure 3A:
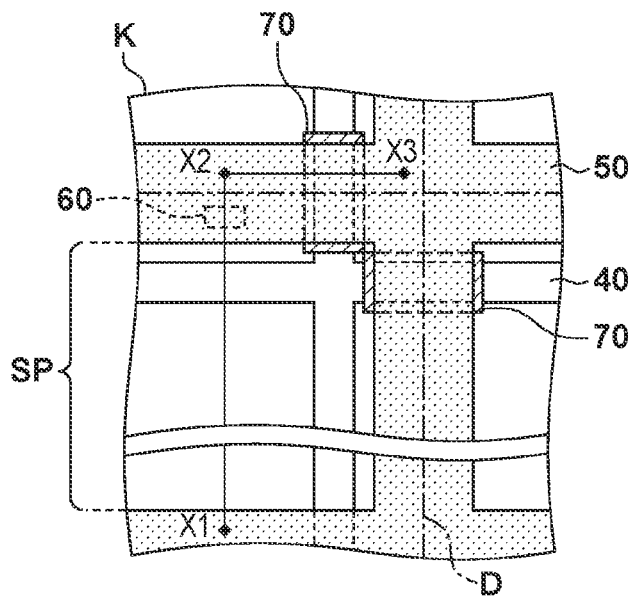
FIGS. 3A and 3B are views for explaining a state in one step of a method of manufacturing an electronic device.
Figure 3B:
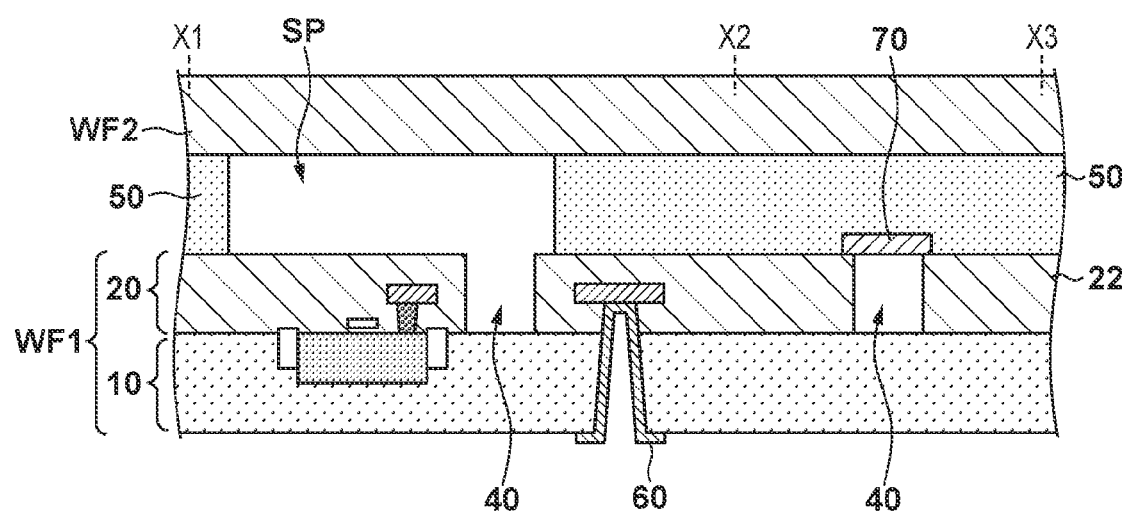

FIG. 3A is an enlarged view of a region K of a first wafer WF1 according to the second embodiment. FIG. 3B is a schematic view of the sectional structure taken along a cut line X1-X2-X3 in FIG. 3A. This embodiment is different from the above-described first embodiment in that at the intersection between a trench 40 and a surrounding member 50, a cover member 70 is arranged between the trench 40 and the surrounding member 50 so as to separate them and prevent the trench 40 from being filled with the surrounding member 50. That is, at the intersection between the trench 40 and the surrounding member 50, the cover member 70 is arranged on an insulating member 22 so as to be laid across the trench 40, thereby preventing the trench 40 from being filled with the surrounding member 50 to be formed later. According to this embodiment, the trench 40 is not filled with the surrounding member 50 at the intersection with respect to the surrounding member 50 in a planar view. Hence, this embodiment is more advantageous than the first embodiment.

FIGS. 4A to 4E show the states of several steps in a manufacturing method according to this embodiment. The steps shown in FIGS. 4A and 4B can be done like the steps shown in FIGS. 2A and 2B.

Figure 4A:
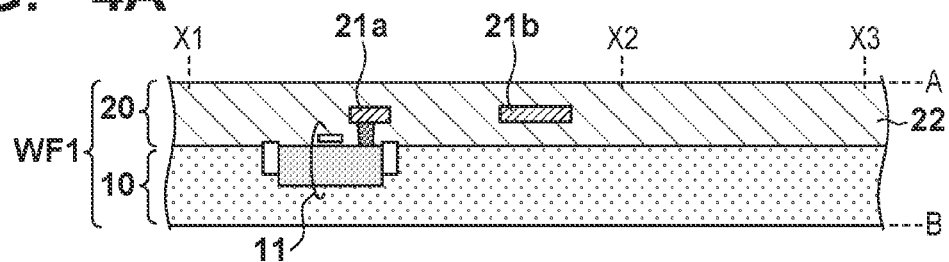
FIGS. 4A to 4E are views for explaining an example of the method of manufacturing the electronic device.
Figure 4B:
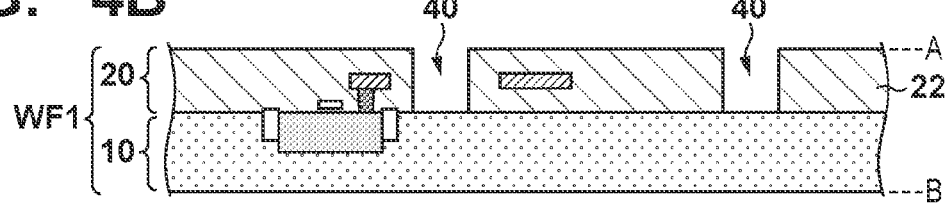
Figure 4C:
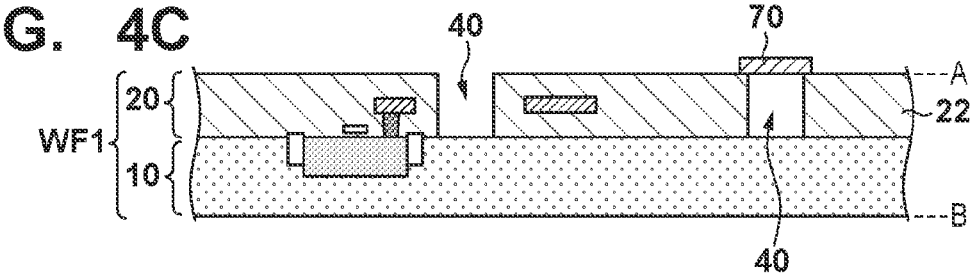

In the step shown in FIG. 4C, the cover member 70 is formed on the first wafer WF1. More specifically, the cover member 70 is formed on the insulating member 22 so as to be laid across a portion of the trench 40, which intersects the surrounding member 50 to be formed later, in a planar view. The cover member 70 preferably uses a material that improves both the adhesion to the insulating member 22 serving as the underlayer of the cover member 70 and the adhesion to the surrounding member 50 formed on the cover member 70. For example, a negative-type UV curing resin is usable. At this time, for example, the viscosity of the resin is set to 300 [cP] or more (preferably 500 [cP] or more) to prevent the trench 40 from being filled with an uncured resin. In this example, a novolac resin having a viscosity of about 1,000 [cP] was applied by spin coating at a rotational speed of about 2,000 [rpm]. Post-bake after exposure/development was performed at about 150[° C.], thereby forming the cover member 70 having a thickness of about 8 [μm].

Figure 4D:
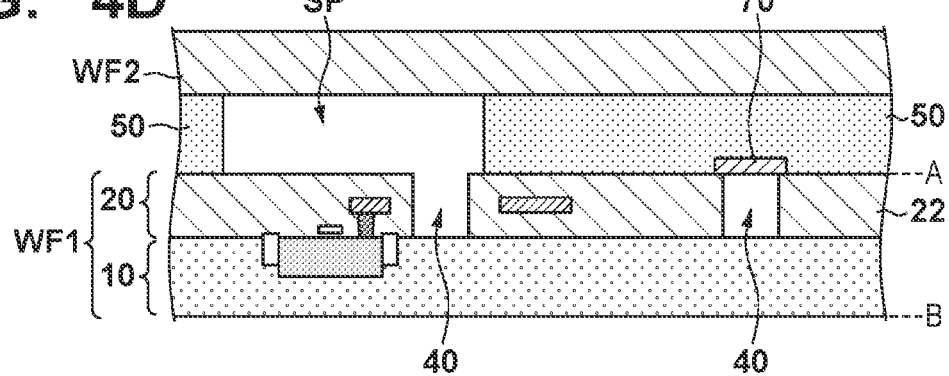
Figure 4E:
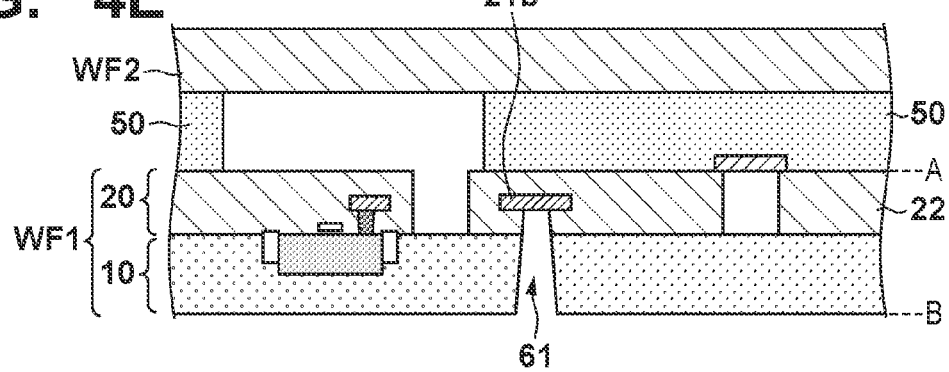

The steps shown in FIGS. 4D and 4E can be done like the steps shown in FIGS. 2C and 2D. However, if these steps are performed under a relatively high temperature, the cover member 70 may melt. Hence, these steps are performed at, for example, a temperature lower than the temperature of the heat treatment to cure the cover member 70.

Figure 5A:
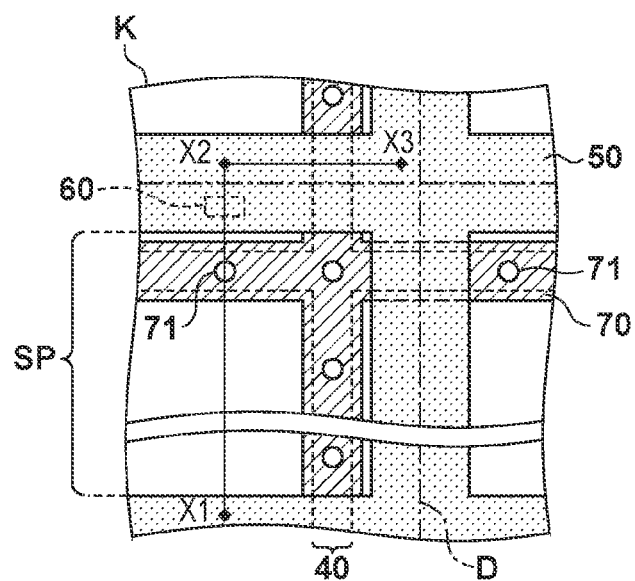
FIGS. 5A and 5B are views for explaining a state in one step of a method of manufacturing an electronic device.
Figure 5B:
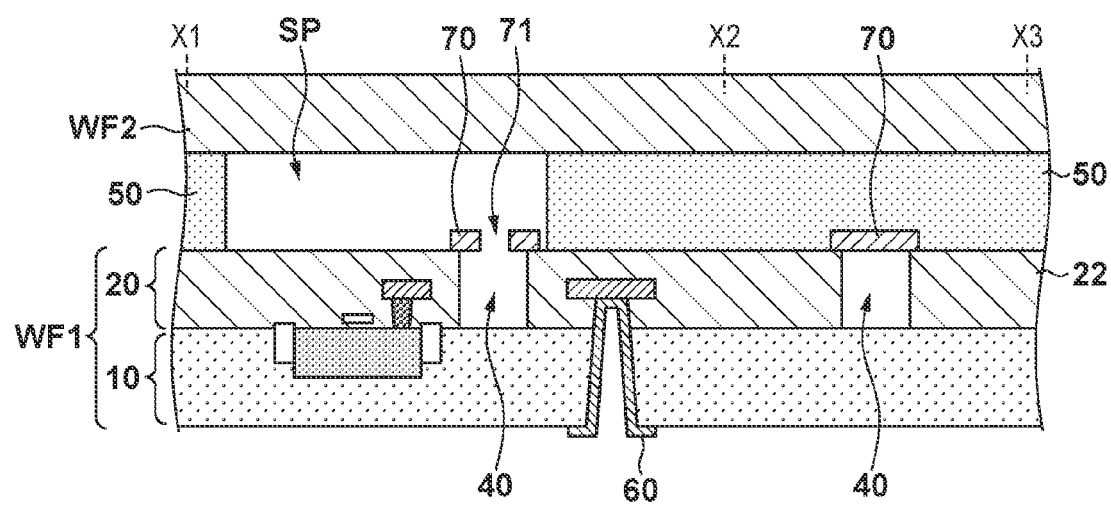

As a modification, FIGS. 5A and 5B show an enlarged view of the region K of the first wafer WF1, and the sectional structure taken along a cut line X1-X2-X3, respectively. As in this modification, the cover member 70 may extend up to positions where the trench 40 and the surrounding member 50 do not intersect (the cover member 70 may be formed to close substantially all portions of the grid-shaped trench 40). In this case, the cover member 70 has a plurality of holes 71 at the positions where the trench 40 and the surrounding member 50 do not intersect such that a space SP communicates with the trench 40. In the above-described case of the UV curing resin, the plurality of holes 71 can be formed by exposure/development. In another example, the holes 71 can also be formed by etching or the like. Each hole 71 needs to be formed in a size not to limit a conductance C described above. In this example, the cover member 70 is about 8 [μm] thick at most, and the conductance C is substantially not limited.

Third Embodiment

Figure 6A:
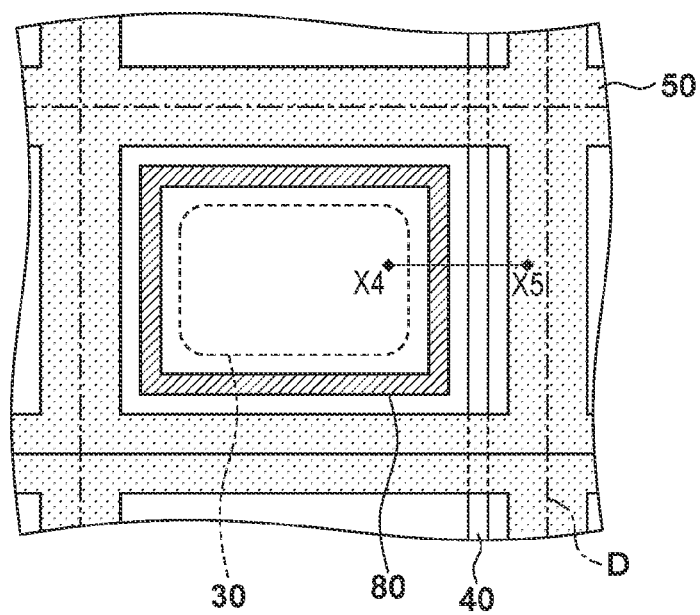
FIGS. 6A and 6B are views for explaining an example of a method of manufacturing an imaging device.
Figure 6B:
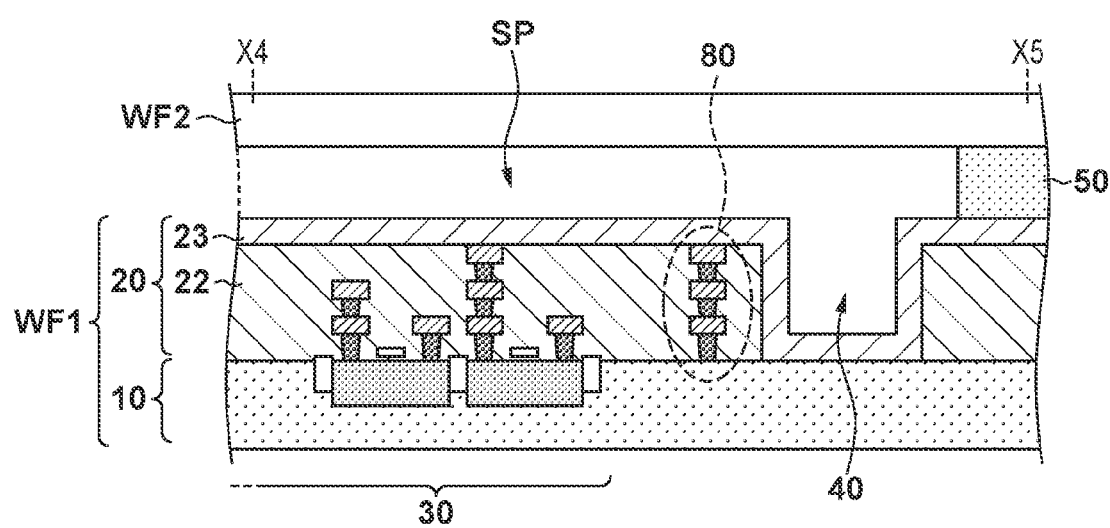

FIG. 6A is an enlarged view of a region K of a first wafer WF1 according to the third embodiment. FIG. 6B is a schematic view of the sectional structure taken along a cut line X4-X5.

First, this embodiment is different from the above-described embodiments in that a wiring structure 20 further includes a guard ring 80 included in an insulating member 22. More specifically, the guard ring 80 can be formed to surround a region 30 in a planar view, and can include a wiring pattern, a contact plug, and a via hole, like a conductive member 21. The guard ring 80 has a function of preventing water or humidity from the trench 40 from entering the inside of the wiring structure 20. Note that in this example, a case in which the number of wiring layers is 3 is shown. However, the number of wiring layers is not limited to that of this example.

Second, this embodiment is different from the above-described embodiments in that a passivation film 23 is formed as the uppermost layer of the wiring structure 20. As the passivation film 23, for example, an inorganic material with a moisture resistance such as silicon nitride or silicon oxynitride is used. Note that in this example, as the passivation film 23, a silicon nitride film having a thickness of about 600 [nm] was formed by plasma CVD.

As described above, since a trench 40 communicates with the external space, water or humidity may enter the inside of the wiring structure 20 via the trench 40 during the manufacture such as a cleaning process of an electronic device. This can lead to corrosion of the conductive member 21 or the like, which lowers the reliability of the electronic device. According to this embodiment, the guard ring 80 and the passivation film 23 can appropriately protect the wiring structure 20 from water and humidity. Hence, this embodiment is more advantageous than the above-described embodiments.

Fourth Embodiment

The electronic device manufacturing method according to each of the above-described embodiments may be applied to an imaging device such as a CCD/CMOS image sensor. FIGS. 7A to 7F show the states of several steps in a method of manufacturing an imaging sensor.

In the step shown in FIG. 7A, a first wafer WF1 with a plurality of pixels PX on a semiconductor substrate 10 is prepared. The plurality of pixels PX are formed in a region 30. Each pixel PX can include, for example, a photodiode PD (photoelectric conversion element), and at least one transistor TR configured to read a signal corresponding to the amount of charges generated and accumulated in the photodiode PD.

In the step shown in FIG. 7B, optical elements 90 corresponding to the pixels PX are formed on an insulating member 22. Each optical element 90 can include, for example, a color filter 91, a microlens 92 (lens array), and a protective film 93. As the protective film 93, for example, a material capable of resisting the condition of the step of forming a cover member 70 later. This can prevent degradation of the microlens 92, or the like. As the protective film 93, for example, silicon oxide, silicon nitride, silicon oxynitride, aluminum oxide, or aluminum nitride can be used. Typically, the same material as that used in the above-described embodiments can be used as the protective film 93. In this example, silicon nitride having a thickness of about 50 [nm] was formed as the protective film 93.

In the step shown in FIG. 7C, a part of the insulating member 22 is removed to form a trench 40. In the step shown in FIG. 7D, the cover member 70 is formed on the insulating member 22 so as to be laid across at least a portion of the trench 40, which intersects a surrounding member 50 to be formed later, in a planar view. As described in the second embodiment above, the cover member 70 may extend up to portions in which the trench 40 and the surrounding member 50 do not intersect. In this case, the cover member 70 has a plurality of holes 71 at the portions where the trench 40 and the surrounding member 50 do not intersect. In the step shown in FIG. 7E, the first wafer WF1 and a second wafer WF2 are adhered via the surrounding member 50 such that a space SP is formed between them. In the step shown in FIG. 7F, an opening 61 is formed on the lower surface side of the first wafer WF1, and an electrode 60 that is a through electrode is formed in the opening 61. Note that the steps shown in FIGS. 7C to 7F are performed like the steps shown in FIGS. 4B to 4E.

Figure 8:
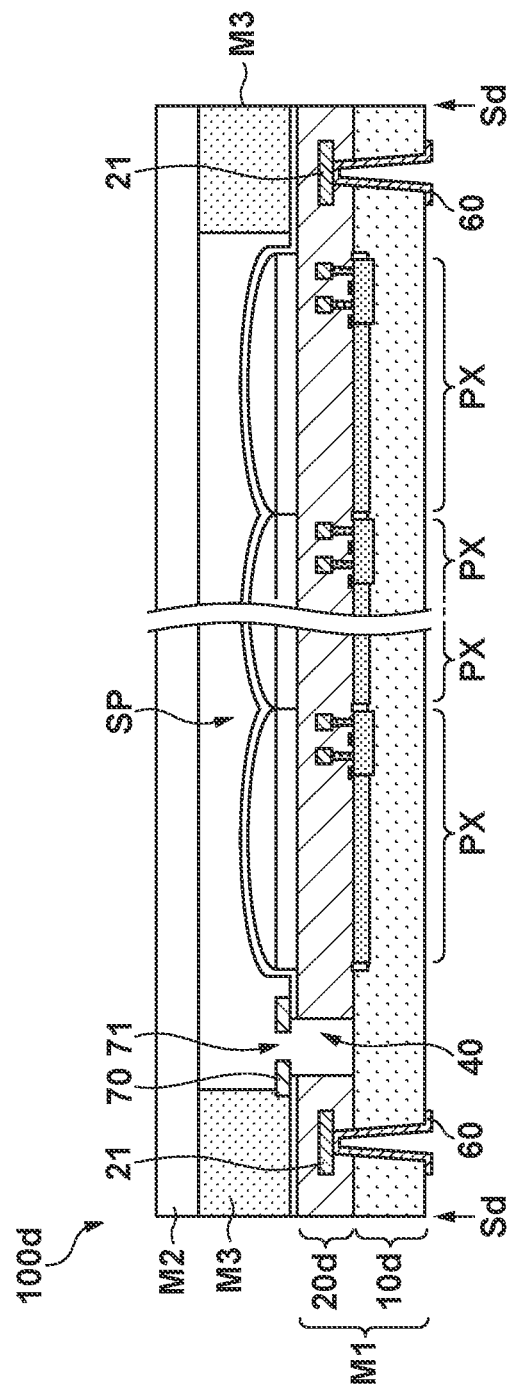
FIG. 8 is a view for explaining an example of the structure of an imaging device.

FIG. 8 shows an example of the structure of an imaging device 100d obtained by a dicing process performed after the step shown in FIG. 7F. Note that in this embodiment, the imaging device 100d will be described as an example. However, the following explanation also applies to the electronic devices exemplified in the first to third embodiments. Some of the embodiments may be combined.

The imaging device 100d includes a first member M1 that is a chip, a second member M2 that is a cover, a third member M3, and the electrode 60. The first member M1 corresponds to a part of the first wafer WF1, and includes a semiconductor substrate 10d and a wiring structure 20d arranged on the semiconductor substrate 10d. The semiconductor substrate 10d corresponds to a part of the semiconductor substrate 10, and the wiring structure 20d corresponds to a part of the wiring structure 20. The second member M2 corresponds to a part of the second wafer WF2 and faces the first member M1 via the space SP. The third member M3 corresponds to a part of the surrounding member 50 and surrounds the space SP. The side surfaces of the first member M1, the second member M2, and the third member M3 substantially match planes Sd of dicing, and are flush with each other. The electrode 60 is arranged on the surface of the first member M1 opposite to the second member M2 so as to penetrate the semiconductor substrate 10d and is connected to a conductive member 21 of the wiring structure 20d.

The first member M1 has the trench 40 in the upper surface. More specifically, in the first member M1, the wiring structure 20d includes an insulating member 22d including the conductive member 21, and the insulating member 22d forms the side surfaces of the trench 40. The trench 40 intersects the third member M3 in a planar view and overlaps the space SP surrounded by the third member M3. The space SP communicates with the external space via the trench 40. The space SP may remain communicating with the external space. However, if necessary, the space SP may be disconnected from the external space by filling the trench 40 with a resin or the like on the planes Sd of dicing in a subsequent step, as already described.

In the imaging device 100d as well, a cover member 70 including holes 71 that make the space SP communicate with the trench 40 may be arranged, as in the second embodiment, although a description thereof will be omitted here. In addition, the wiring structure 20d may further include a guard ring 80, and/or the insulating member 22d may further include a passivation film 23, as in the third embodiment, although not illustrated here.

The imaging device 100d is applicable to a camera. The concept of the camera includes not only apparatuses (for example, a digital still camera) mainly aiming at shooting but also apparatuses (for example, a personal computer or a portable terminal) having an auxiliary shooting function. For example, the camera can include the imaging device 100d, and a processing unit that processes a signal output from the imaging device 100d. The signal output from the imaging device 100d may be an analog signal. However, if the imaging device 100d includes an A/D converter, the imaging device 100d outputs a digital signal. The processing unit of the camera can include a processor that processes the digital signal.

In this example, a structure including the wiring structure 20 located on the side of the surface A and the semiconductor substrate 10 located on the side of the surface A has been exemplified. However, the position relationship may be reversed (this also applies to a so-called back-side illumination imaging device). A method of manufacturing an imaging device has been described here as an example. However, the manufacturing method may be applied to another electronic device. The manufacturing method is also applicable to, for example, various kinds of sensors such as a gyro sensor, a SAW (Surface Acoustic Wave) device, and other MEMSs.

Other Embodiments

Several preferred embodiments have been described above. However, the present invention is not limited to these examples and may partially be modified without departing from the scope of the invention. Individual terms described in this specification are merely used for the purpose of explaining the present invention, and the present invention is not limited to the strict meanings of the terms and can also incorporate their equivalents.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-074601, filed on Apr. 1, 2016, which is hereby incorporated by reference herein in its entirety.

What is claimed is:

1. A method of manufacturing an electronic device, comprising:
    fixing a first wafer and a second wafer to each other via a surrounding member, such that the first wafer and the second wafer face each other via a space and the surrounding member surrounds the space, the first wafer including a semiconductor substrate and a wiring structure arranged on the semiconductor substrate; and
    forming an opening on a side of a second surface of the first wafer on an opposite side of a first surface on a side of the second wafer so as to expose a conductive member of the wiring structure, and then forming an electrode connected to the conductive member exposed via the opening,
    wherein in the fixing, the first wafer includes, on a side of the first surface, a trench that intersects the surrounding member in a planar view of the first surface, and
    in the forming, the electrode is formed under a condition that the space communicates with an external space via the trench.

2. The method according to claim 1, wherein in the fixing, a cover member is arranged between the surrounding member and the trench at a position where the surrounding member intersects the trench in the planar view.

3. The method according to claim 2, wherein the cover member extends up to a position where the surrounding member does not intersect the trench in the planar view, and includes a hole that makes the space communicate with the trench.

4. The method according to claim 1, wherein in the first wafer, the semiconductor substrate is arranged on the side of the second surface, and the wiring structure is arranged on the side of the first surface, and
    in the forming, the electrode is formed through the semiconductor substrate from the side of the second surface to the side of the first surface so as to reach the conductive member.

5. The method according to claim 1, wherein in the forming, a conductive film that covers a side surface and a bottom surface of the opening and a part of a periphery of the opening on the second surface is formed, thereby forming the electrode.

6. The method according to claim 1, wherein the wiring structure includes an insulating member including the conductive member, and
    a side surface of the trench is formed by the insulating member.

7. The method according to claim 6, wherein the insulating member is formed from a plurality of insulating layers, and the conductive member is arranged between the plurality of insulating layers.

8. The method according to claim 7, wherein an uppermost layer of the plurality of insulating layers is made of a material having a moisture resistance higher than a moisture resistance of insulating layers other than the uppermost layer of the plurality of insulating layers, and the uppermost layer forms the side surface and a bottom surface of the trench.

9. The method according to claim 6, wherein the wiring structure further includes a guard ring included in the insulating member and arranged between the trench and the conductive member, and
    the trench is located between the guard ring and the surrounding member in the planar view.

10. The method according to claim 1, wherein in the forming, the surrounding member is formed into a grid-shaped pattern between the first wafer and the second wafer.

11. The method according to claim 10, wherein the first wafer includes a plurality of regions partitioned by the grid-shaped surrounding member in the planar view,
    the electrode is one of a plurality of electrodes corresponding to the plurality of regions, respectively, and
    the method of manufacturing the electronic device further comprises, after the forming, dicing the first wafer and the second wafer fixed to each other via the grid-shaped surrounding member along the grid-shaped surrounding member.

12. The method according to claim 10, wherein in the fixing, the grid-shaped surrounding member is formed along a first direction and a second direction, and the trench is formed along at least one of the first direction and the second direction.

13. The method according to claim 1, wherein the first wafer further comprises a lens array formed in a region on the side of the first surface, which is surrounded by the surrounding member in the planar view.

14. The method according to claim 1, wherein the forming comprises forming the opening by etching the side of the second surface of the first wafer under a condition of a pressure lower than in the fixing, and forming the electrode by depositing a conductive film in the opening under a condition of a temperature higher than in the fixing.

* * * * *